United States Patent
Sutterlin et al.

(10) Patent No.: US 9,681,461 B2
(45) Date of Patent: *Jun. 13, 2017

(54) METHOD AND SYSTEM OF ENHANCING SIGNAL PROCESSING IN A SHARED MEDIUM NETWORK

(71) Applicant: Echelon Corporation, San Jose, CA (US)

(72) Inventors: Philip H. Sutterlin, Saratoga, CA (US); Glen M. Riley, Saratoga, CA (US); Walter J. Downey, Los Gatos, CA (US)

(73) Assignee: Echelon Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/006,787

(22) Filed: Jan. 26, 2016

(65) Prior Publication Data

US 2016/0157249 A1 Jun. 2, 2016

Related U.S. Application Data

(63) Continuation of application No. 13/838,970, filed on Mar. 15, 2013, now Pat. No. 9,356,854.

(51) Int. Cl.
*H04L 12/26* (2006.01)
*H04W 72/08* (2009.01)
(Continued)

(52) U.S. Cl.
CPC ......... *H04W 72/085* (2013.01); *H03M 13/09* (2013.01); *H04L 12/413* (2013.01); *H04L 43/16* (2013.01); *H04W 74/0841* (2013.01)

(58) Field of Classification Search
None
See application file for complete search history.

(56) References Cited

U.S. PATENT DOCUMENTS 4,562,582 A * 12/1985 Tokura ............... G11B 20/1419
375/282
4,573,045 A * 2/1986 Galin ................... H04L 12/413
370/447

(Continued)

FOREIGN PATENT DOCUMENTS

GB 2424799 10/2006

OTHER PUBLICATIONS

Extended European Search Report (Application 14159834.2), Jun. 27, 2014, 7 pages.

*Primary Examiner* — Brian Roberts
(74) *Attorney, Agent, or Firm* — Nicholson De Vos Webster & Elliott LLP (57) ABSTRACT

A method implemented in a device is disclosed for networking through signals transmitted across a shared medium network. The method starts with monitoring for a first signal on a shared medium of the shared medium network. The first signal is processed after it is received and while the first signal is being processed, a set of one or more signals is received on the shared medium. Then a set of one or more amplitude increases is determined, where each amplitude increase is from an earlier received signal to a later received signal. The set of one or more amplitude increases is compared to a threshold value and at least partially in response to the comparison, the device discards one or more signals from the first signal and the set of one or more signals.

23 Claims, 8 Drawing Sheets

(51) Int. Cl.
*H04L 12/413* (2006.01)
*H04W 74/08* (2009.01)
*H03M 13/09* (2006.01)

(56) References Cited

U.S. PATENT DOCUMENTS

| | | | | |
|---|---|---|---|---|
| 4,701,909 | A | * | 10/1987 | Kavehrad ............... H04L 12/44 370/446 |
| 5,327,828 | A | * | 7/1994 | Barocas .................. B41F 15/36 101/127 |
| 5,657,326 | A | * | 8/1997 | Burns .................... H04L 12/413 370/349 |
| 5,910,851 | A | * | 6/1999 | Flaherty ................. H04B 10/40 398/110 |
| 5,946,118 | A | * | 8/1999 | Flaherty ................. H04L 12/413 370/447 |
| 6,243,393 | B1 | | 6/2001 | Fitzgerald |
| 7,420,986 | B1 | * | 9/2008 | Howard ............. H04L 12/2801 370/222 |
| 8,300,538 | B2 | | 10/2012 | Kim et al. |
| 2003/0026283 | A1 | * | 2/2003 | Currivan ................ H04L 12/44 370/441 |
| 2007/0211751 | A1 | * | 9/2007 | Yoshikawa ....... H04W 74/0825 370/447 |
| 2010/0110913 | A1 | | 5/2010 | Min |
| 2012/0320768 | A1 | | 12/2012 | Shaffer et al. |
| 2012/0329415 | A1 | | 12/2012 | de Ruijter |
| 2013/0083648 | A1 | | 4/2013 | de Ruijter |

* cited by examiner

METHOD AND SYSTEM OF ENHANCING SIGNAL PROCESSING IN A SHARED MEDIUM NETWORK

FIELD OF THE INVENTION

The invention relates to signal processing in a communication system. Specifically, it relates to signal processing in a shared medium network.

PRIOR ART AND RELATED ART

A communication system often utilizes a shared medium for communication. The shared medium is a medium or channel of information transfer that serves multiple devices. With multiple devices sharing the medium, a channel access method is needed to avoid collision. For example, a well-known method of collision avoidance in a communication system is the carrier sense multiple access with collision avoidance (CSMA/CA) protocol. A device in a CSMA/CA system senses whether or not the shared medium is used (e.g., by transmission of another device), and the device transmits only when the shared medium is idle.

However, a CSMA/CA system does not eradicate collisions. When two devices on a network are unable to hear each other (for example due to being out of detectable range from each other or due to an interference source impacting reception) they may transmit signals simultaneously or at overlapping times to the shared medium, and the signals transmitted will collide and messages carried in the signals may be garbled such that they can't be properly received at their destinations. In this kind of scenario, a first device is not aware of a second device's transmission, thus the second device is "hidden" from the first device. This is often referred to as the "hidden node problem" or "hidden terminal problem," the node/terminal being the device discussed herein.

SUMMARY OF THE INVENTION

A first method implemented in a device is disclosed for networking through signals transmitted across a shared medium network. The method starts with monitoring for a first signal by any number of methods that may be used to distinguish data carrying signals from noise on a shared medium of the shared medium network. The first signal is processed as it is received and while the first signal is being processed, a set of one or more signals is received on the shared medium. Then a set of one or more amplitude increases is determined, where each amplitude increase is from an earlier received signal to a later received signal. The set of one or more amplitude increases is compared to a threshold value and, at least partially in response to the comparison, the device discards one or more signals from the first signal and the set of one or more signals.

A second method implemented in a device is disclosed for networking through signals transmitted across a shared medium network. The method starts with monitoring for a first signal by any number of methods that may be used to distinguish data carrying signals from noise on a shared medium of the shared medium network. The first signal is processed as it's received and while the first signal is being processed, a set of one or more signals is received and processed from the shared medium. The validity statuses of error-detecting codes associated with messages carried by the first signal and the set of one or more signals are compared. At least partially in response to the comparison, the device discards one or more signals from the first signal and the set of one or more signals.

DETAILED DESCRIPTION

In the following description, numerous specific details are set forth. However, it is understood that embodiments of the invention may be practiced without these specific details. In other instances, well-known circuits, structures and techniques have not been shown in detail in order not to obscure the understanding of this description. It will be appreciated, however, by one skilled in the art that the invention may be practiced without such specific details. Those of ordinary skill in the art, with the included descriptions, will be able to implement appropriate functionality without undue experimentation.

References in the specification to "one embodiment," "an embodiment," "an example embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to effect such feature, structure, or characteristic in connection with other embodiments whether or not explicitly described.

In the following description and claims, the terms "coupled" and "connected," along with their derivatives, may be used. It should be understood that these terms are not intended as synonyms for each other. "Coupled" is used to indicate that two or more elements, which may or may not be in direct physical or electrical contact with each other, co-operate or interact with each other. "Connected" is used to indicate the establishment of communication between two or more elements that are coupled with each other.

Figure 1:
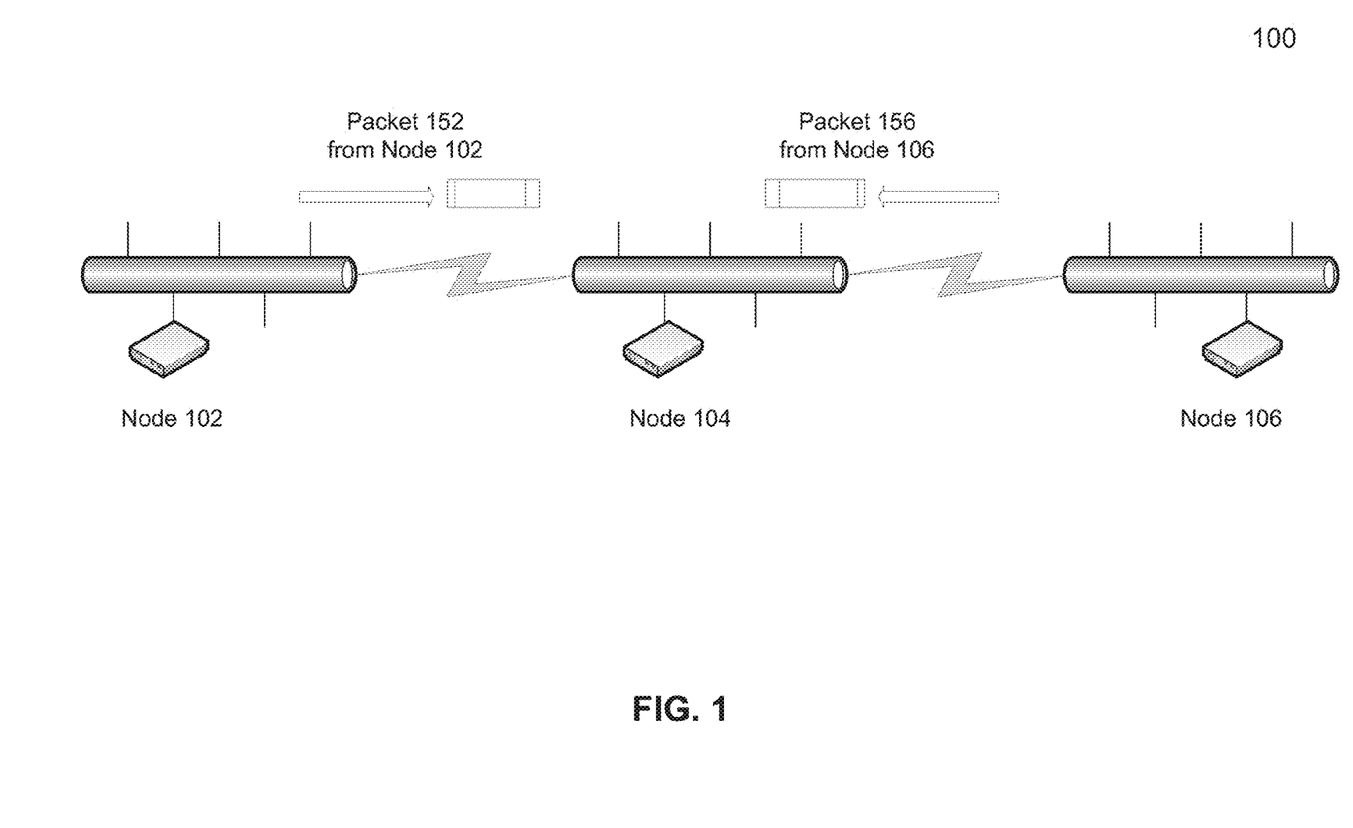
FIG. 1 illustrates the hidden node problem in a shared medium network.

FIG. 1 illustrates the hidden node problem in a shared medium network. Network 100 has a shared medium coupled with various apparatuses. The shared medium can be a power line, a radio frequency (RF) channel, an optical fiber, a copper line, or other suitable medium for communication (e.g., fluid, gas, or solid molecule vibration or motion). The various apparatuses coupled on the shared medium are represented by nodes 102, 104, and 106.

In the example, both nodes 102 and 106 sense the shared medium and determine if the shared medium is idle. When they sense no signal is transmitted across the shared medium, nodes 102 and 106 send out packets 152 and 156 respectively on the shared medium, destined to node 104. The two nodes are not aware of each other's transmission for various reasons (thus the "hidden node problem"). When the shared medium is a RF channel or a wired line, each node has a range, beyond which the node's signal can't be detected by another node. Nodes 102 and 106 can be outside of each other's range, even though node 104 is within both nodes' range. Thus nodes 102 and 106 may transmit at overlapping times to node 104. As a result, node 104 will miss both transmissions due to signal collision.

An existing approach to address the hidden node issue is for nodes that have a message to transmit to send handshake packets prior to message transmission. Each node with a message to send first sends a request to transmit (RTS) that includes an identifier and other fields such as pending message length. The requesting nodes are only allowed to transmit if they receive a clear to send (CTS) message containing their identifier. This approach consumes extra bandwidth for the RTS/CTS packets, and may suffer from the same issue where node 104 can't receive either RTS packet without error, or where the identifier is not sufficiently unique. For these reasons, this technique does not scale well to networks with large numbers of nodes. It is also not well suited to either peer-to-peer networks, or networks with multiple access points that are able to detect transmission from nodes associated with alternate access points.

Another existing approach is to increase the transmission power of each node and/or increase receiver sensitivity of each node) so that all nodes are able to detect signals from all other nodes and thus a CSMA/CA like protocol would be able to avoid collision. This approach is only applicable to a shared medium network that is fully isolated from devices of neighboring networks, where interference between networks is not a concern. This limitation prevents the approach from being a viable solution in many instances. An opposite approach is to reduce the transmission power in an attempt to avoid network overlap. This approach suffers from the limitation that with reduced power there may not be sufficient signal strength at all intended receivers and it exacerbates the likelihood of nodes on the same network becoming hidden from each other.

A different existing approach is to modify the behavior of a receiving node, where the receiving node continues monitoring for a preamble at the shared medium while processing a message. Once a preamble is identified, the receiving node discards the currently partially processed message and processes the newly identified message. This approach suffers from the limitation that the body of the message to be sent must not contain patterns that might be interpreted as detection of a new packet—thus requiring additional packet overhead to use other patterns instead. This is a significant limitation—especially when the receiving node needs to detect preambles that are corrupted by the channel, as well as unimpaired preambles.

Other existing approaches have been deployed to address the issue too, such as employing frequency or time separation of transmissions from nodes in neighboring networks. Time separation reduces the communication bandwidth available to a node, or a group of nodes, in order for the shared medium to be shared with others. Thus time separation is often not a viable solution. Frequency separation is a viable solution in some situations but for networks of nodes occupying overlapping detection space it places a much greater demand on receiver selectivity and linearity. In addition, many applications have a limited available frequency range preventing a viable frequency separation solution.

Figure 2:
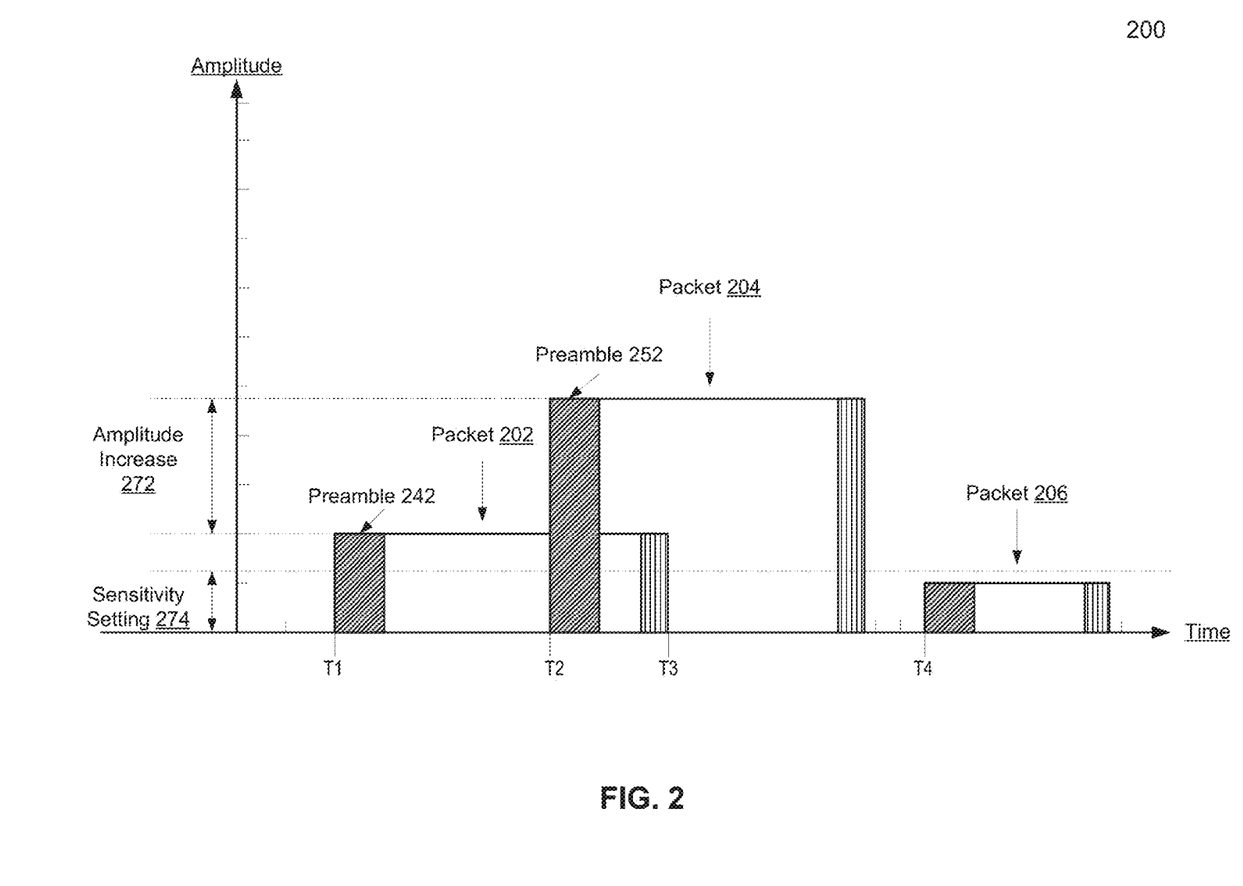
FIG. 2 illustrates a first approach of processing overlapping signals at a node of a shared medium network according to an embodiment of the invention.

FIG. 2 illustrates a first approach of processing overlapping signals at a node of a shared medium network according to an embodiment of the invention. In FIG. 2, the horizontal axis represents passage of time, and the vertical axis represents amplitudes of signals detected at a receiving node (e.g., node 104 in FIG. 1). The node monitors the shared medium constantly for signals carrying message. Note signals include analog formation detected on the shared medium, and embedded information carried through packet, frames, or other formats while being processed through the receiving node. At time T1, the node detects packet 202. In one embodiment, the node recognizes packet 202 by detecting a preamble pattern that may include one or more modulated or unmodulated carrier signals which may also include a syncword or sync character carried with the packet. The preamble may also consist of, or include, other signal patterns that are used to distinguish the presence of a packet from noise, such as a chirp signal. A preamble is generally a signal with characteristics known to devices that co-operate to share the media, as well as providing other functions. Once the preamble 242 is detected, the node starts to process packet 202. The node finishes processing the packet at time T3.

While the node is processing packet 202, packet 204 is being transmitted, with it appearing at the node at T2. That is, packets 202 and 204 are carried by overlapping signals. The node recognizes preamble 252. The node may choose to ignore packet 204 since it is processing an earlier packet, packet 202. Yet the latter packet may contain a message for the node (thus a valid later packet) while the former packet may be a packet "leaked" over from an adjacent network (thus an invalid earlier packet). Ignoring all subsequent packets while the node is processing a packet would miss signals carrying valid packets/messages.

In this first approach, once a node detects a second signal while it is processing a first signal, the node checks the amplitude of the second signal and compares it to the first signal. If the second signal has a higher amplitude, and the amplitude increase from the first signal to the second signal is over a threshold value, the node aborts processing the first signal and starts to process the second signal. The rationale is that when a second signal is sufficiently higher than the first signal in amplitude, the remainder of the first signal will likely be unrecoverable. Thus, the node should process the second signal instead of the first signal with much lower amplitude. On the other hand, if the second signal has an amplitude not much higher than the first signal being processed, or, the second signal even has a lower amplitude, the node should not halt processing the first signal as processing the second signal is deemed to not offer sufficient benefit.

In FIG. 2, amplitude increase 272 represents the node's determination of amplitude difference between packets 202 and 204. The amplitude increase 272 is then compared to a threshold value, and when the increase exceeds the threshold value, packet 202 is discarded by the node, and the node starts to process packet 204.

Note that amplitude may be defined differently in different embodiments. For example, in one embodiment, peak amplitude is used, where the signal is measured at its maximum absolute value above a zero value in a time period. In another embodiment, root mean square (RMS) amplitude is used, where the signal is measured for the square root of the mean squared amplitude over a period of time. Different measurements of amplitude are not essential to the embodiments of the invention as long as all signals use the same measurement of amplitude so the amplitudes of different signals detected on the shared medium are comparable. Alternately the term 'amplitude' could refer to an indication of signal quality, for example, a level of correlation to an expected pattern.

In one embodiment, instead of comparing an absolute value of the amplitude increase, a relative change is measured. For example, a logarithmic unit, the decibel (dB), is used to indicate the ratio of absolute values of amplitude. In some shared medium systems, the amplitude of signal changes widely—for example, in a power line communication (PLC) system, amplitude changes between signals can reach 80 dB. In these systems, the threshold value can be a ratio. For example, a PLC system may set an amplitude increase threshold to be a value between 6 dB and 20 dB. The threshold may not be fixed and it may be configurable at each node as the range of amplitude received at each node differs depends on the node's circumstance. In alternative, the threshold may be configurable but each node shares the same amplitude increase threshold. Note when the shared medium network is a PLC system, the signals transmitted across the PLC system may comply with various standards such as G3-Power Line Communication (PLC) physical layer specification, IEEE 1901.2 (currently "Draft" status), and ITU-T G. 9902 and G. 9903 and G.9904 (published).

In some embodiments, the approach of FIG. 2 discussed so far is revised by adding a sensitivity setting check. Referring to FIG. 2, sensitivity setting 274 applies to the node, and only a signal with its amplitude over the sensitivity setting will be processed. Thus, packet 206 is ignored, even though the node may recognize the packet otherwise. The advantage of adding a sensitivity setting is that it may filter out signals not carrying valid messages for the shared medium network, or for a subset of the shared medium network. With lower amplitude signals being filtered out, the node will be less likely run into overlapping signal situations, thus the processing of signal will be more efficient. Note sensitivity setting 274 may be configurable, and it may be configured differently for different nodes within a shared medium network or it may be configured the same value for all nodes depending on embodiments.

While FIG. 2 illustrates the first approach with two overlapping signals, the approach is not so limited. Multiple overlapping signals may be received, and the system may determine which signal or signals to discard depending on amplitude increase(s) from one signal to another.

Figure 3:
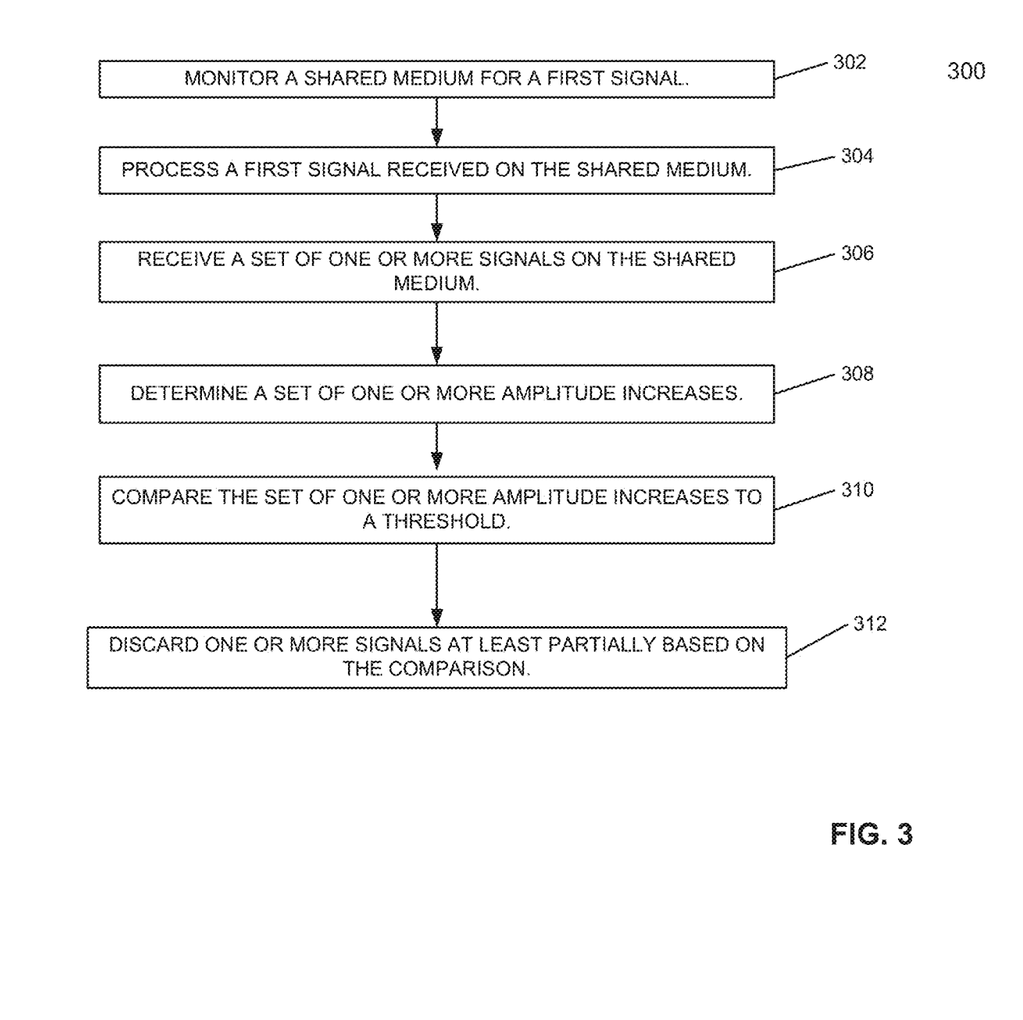
FIG. 3 is a flow diagram illustrating the first approach of processing overlapping signals at a node of a shared medium network according to an embodiment of the invention.

FIG. 3 is a flow diagram illustrating the first approach of processing overlapping signals at a node of a shared medium network according to an embodiment of the invention. Method 300 illustrated in FIG. 3 may be implemented on a node of a shared medium system. The shared medium is one of a power line, a radio frequency channel, an optical fiber, a copper line, and other suitable medium for communication (e.g., fluid, gas, or solid molecule vibration or motion), depending on implementation. The shared medium network contains a number of devices coupled to the shared medium, and the devices (e.g., nodes 102, 104, and 106 of FIG. 1) communicate through signals transmitted through the shared medium network.

Referring to FIG. 3, at reference 302, the method starts with a device of the shared medium system monitoring the shared medium for a first signal to process. In one embodiment, the first signal needs to have an amplitude higher than a sensitivity setting before it will be processed. When the first signal is recognized, it is processed for the message carried in the first signal at reference 304 by the device. While the device is processing the first signal, the device simultaneously monitors the shared medium. A set of one or more signals is received from the shared medium at reference 306. The set of one or more signals is received where signals within the set arrive at overlapping time, either with the first signal or with each other.

Then at reference 308, the device determines a set of one or more amplitude increases. The amplitude increases are measured from an earlier received signal to a later received signal, where the signals include the first signal and the set of one or more signals. When there is an amplitude decreases from the earlier signal and the later signal, the amplitude increase value is a negative value.

Onward to reference 310, the set of one or more amplitude increases is compared to a threshold. The threshold may be an absolute amplitude value in one embodiment, but it may be a logarithmic unit (e.g., a decibel (dB)) in another embodiment. The threshold may be configurable and different for each node in one embodiment. In another embodiment, the threshold is configurable and each node has the same threshold value.

Then at reference 312, the method discards one or more signals at least partially based on the comparison. The discarded signal or signals can be the first signal, or one or more of the set of signals. For example, when the amplitude of a later signal is no higher than that of an earlier signal, or an amplitude increase from the earlier signal to the later signal is lower than the threshold value, the later signal is discarded; otherwise the packet contents associated with the earlier signal are discarded. When the first signal is being processed and an amplitude increase from the first signal to a later received second signal is over the threshold, the device aborts processing the first signal and starts processing the later received second signal.

In one embodiment, the device only processes signals over a sensitivity setting, thus amplitudes of both the first and the set of one or more signals are above the sensitivity setting. The sensitivity setting is configurable like the threshold, and it may be configured differently or the same across devices of a shared medium networks depending on embodiments.

In one embodiment, the device also discards one or more signals in response to a determination that the one or more signals of the set of one or more signals is not destined to the device. The determination may be made by examining the destination addresses of the packets carried in the signals.

Method 300 expands the idea illustrated in FIG. 2 and applies it to scenarios where multiple signals are received in overlapping time. As discussed herein above, with multiple signals received, one or more signals may be discarded at least partially based on amplitude increases between signals. As will be discussed in more detail herein below, the discarding decision may be aided by other factors besides signal destination determination.

Figure 4:
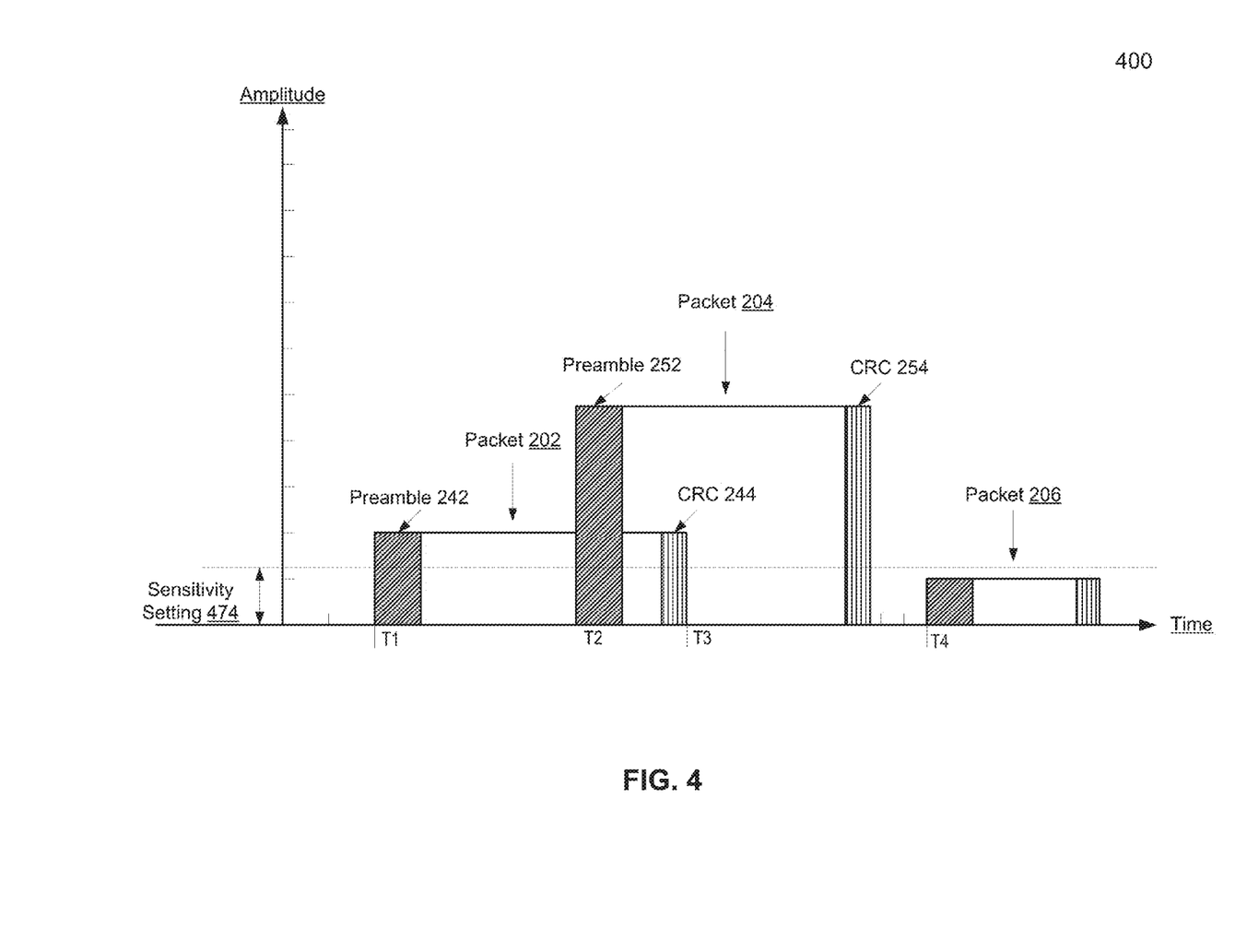
FIG. 4 illustrates a second approach of processing overlapping signals at a node of a shared medium network according to an embodiment of the invention.

FIG. 4 illustrates a second approach of processing overlapping signals at a node of a shared medium network according to an embodiment of the invention. FIG. 4 is similar to FIG. 2 and the same or similar references indicate entities or elements having the same or similar functionalities.

Referring to FIG. 4, packets 202 and 204 are received at a node overlapping in time. Instead of checking an amplitude increase from packet 202 to packet 204 though, the node processes the second packet without considering its amplitude level as the second packet is received from the shared medium. After both packets are processed at the node, the node checks the validity statuses of the error-detecting codes associated with the decoded packet and determines which packet to accept. In this example, a cyclic redundancy check (CRC) code is used for error detecting and correction (as CRCs 244 and 254 for packets 202 and 204 respectively), but other error detecting and/or correction codes can be used to implement the method.

When one of the packets contains a valid CRC code, the packet with a valid CRC code is further processed at the device for forwarding and other operations. When both packets contain valid CRC codes, the device may use a different mechanism to pick one for further processing. For example, using amplitude increase level from packets 202 to 204 to break the tie. If neither packet contains a valid CRC code, both packets may be discarded as invalid CRC codes indicate both packets have been garbled already and the device no longer needs to process the packets further.

Also similar to FIG. 2, the device may have a sensitivity setting (as shown as sensitivity setting 474 in FIG. 4). Similar to sensitivity setting 274 in FIG. 2, sensitivity setting 474 may be configurable, and it may be configured differently for different nodes within a shared medium network or it may be configured the same value for all nodes depending on embodiments.

While FIG. 4 illustrates the second approach with two overlapping signals, the approach is not so limited. Multiple overlapping signals may be received, and the system may determine which signal or signals to discard depending on validity statuses of the signals.

Figure 5:
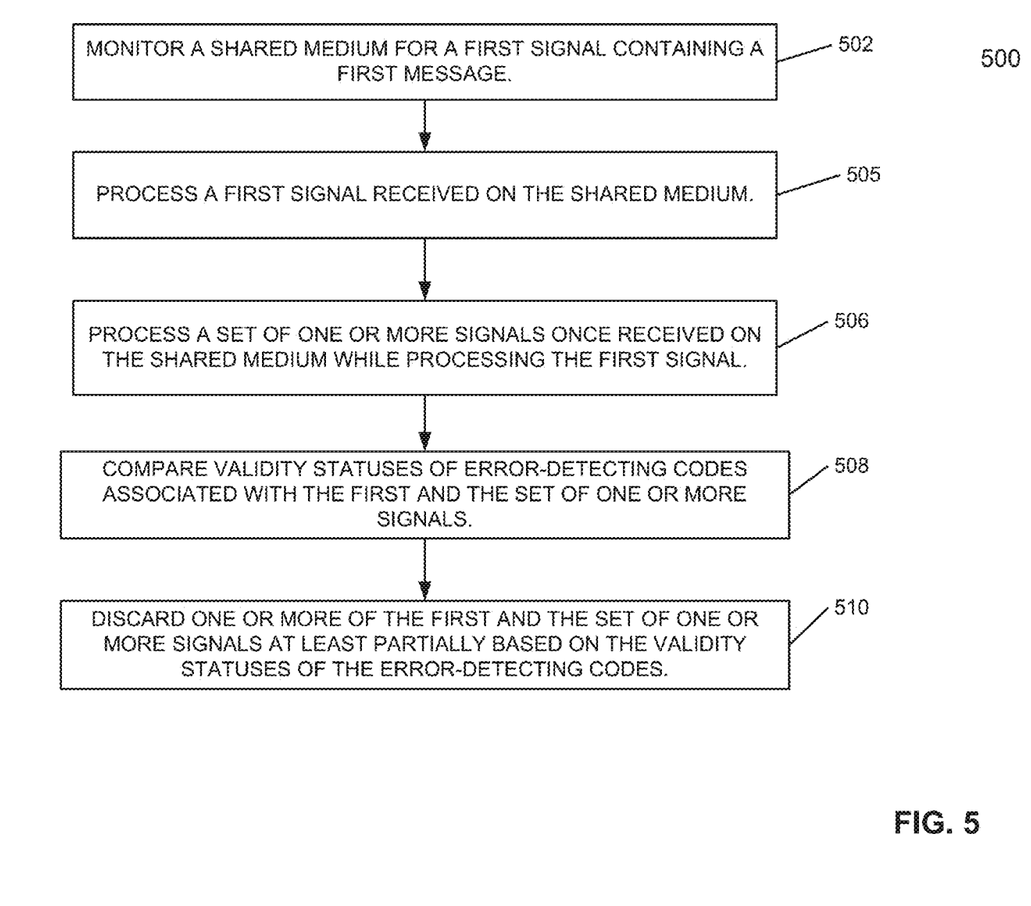
FIG. 5 is a flow diagram illustrating the second approach of processing overlapping signals at a node of a shared medium network according to an embodiment of the invention.

FIG. 5 is a flow diagram illustrating the second approach of processing overlapping signals at a node of a shared medium network according to an embodiment of the invention. Method 500 illustrated in FIG. 5 may be implemented on a node of a shared medium system. The shared medium is one of a power line, a radio frequency channel, an optical fiber, a copper line, and other suitable medium for communication (e.g., fluid, gas, or solid molecule vibration or motion, depending on implementation. The shared medium network contains a number of devices coupled to the shared medium, and the devices (e.g., nodes 102, 104, and 106 of FIG. 1) communicate through signals transmitted through the shared medium network.

Referring to FIG. 5, the method starts with a device of the shared medium system monitoring the shared medium for a first signal to process at reference 502. In one embodiment, the first signal needs to have an amplitude higher than a sensitivity setting before it can be recognized and processed. When the first signal is recognized, it is processed for the message carried in the first signal at reference 505 by the device. While the device is processing the first signal, the device simultaneously monitors the shared medium for more signals. At reference 506, the device processes a set of one or more signals to obtain a set of one or more messages once the signals are received while the device is processing the first signal.

Onward to reference 508, the device checks validity statuses of error-detecting codes associated with the first and the set of one or more messages. At least partially depending on the found validity statuses of the messages, the device discards one or more messages from the first and the set of one or more messages at reference 510.

Note the error-detecting codes associated with the first and the set of one or more messages may be implemented in a variety of ways. For example, it can be a cyclic redundancy check (CRC) code, a checksum code, or other error-correcting codes. When the shared-medium system is a power line communication system, a variety of CRC code implementation may be suitable, for example, CRC-16, CRC-18, or CRC-32. Also, when the shared medium network is a PLC system, the signals transmitted across the PLC system may comply with various standards such as G3-Power Line Communication (PLC) physical layer specification, IEEE 1901.2 (currently "Draft" status), and ITU-T G. 9902 and G. 9903 and G.9904 (published).

In one embodiment, the device also discards one or more signals in response to a determination that the one or more signals of the set of one or more signals is not destined to the device. The determination may be made by examining the destination addresses of the packets carried in the signals.

Figure 6:
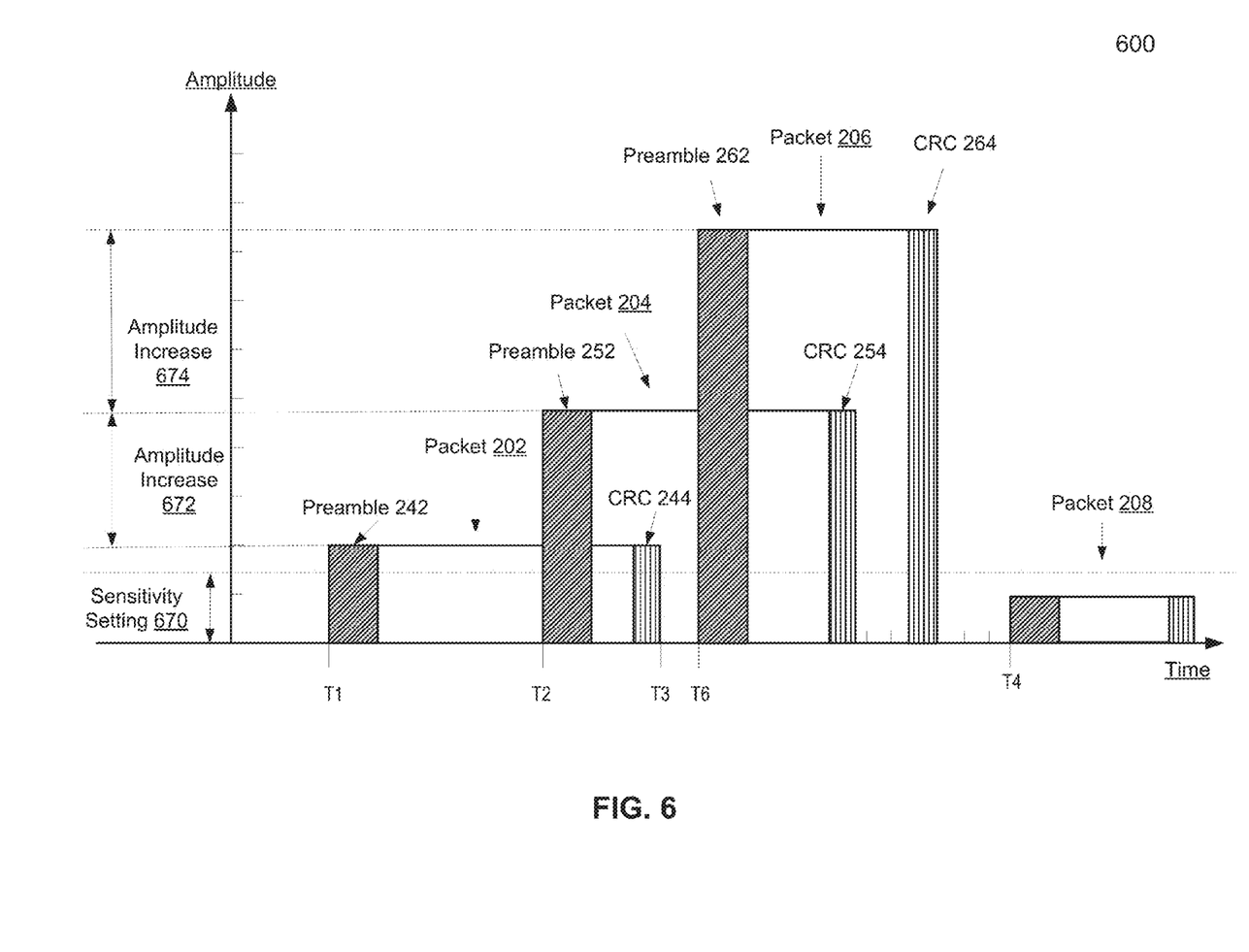
FIG. 6 illustrates an approach of processing overlapping signals at a node of a shared medium network integrating the first and the second approaches according to an embodiment of the invention.

In some embodiments, the first approach disclosed above in relation to discussion of FIGS. 2 and 3 is integrated with the second approach disclosed above in relation to discussion of FIGS. 4 and 5. FIG. 6 illustrates an approach of processing overlapping signals at a node of a shared medium network integrating the first and the second approaches according to an embodiment of the invention.

In FIG. 6, three overlapping signals carry packets 202, 204, and 206 respectively. The system monitors CRC validity statuses (CRCs 244, 254, and 264) of overlapping packets. For example, when the system processes packets 202 and 204, it monitors CRC 264 for validity status of packet 206. At the same time, the system monitors amplitude increase levels. With more than two signals overlapping, there are multiple amplitude increase values. For example, with packets 202, 204, and 206, there are three amplitude increase values for increases from packets 202 to 204, packets 204 to 206, packets 202 to 206.

In one embodiment, the system processes packet 202 while receiving packet 204. The system determines whether packet 204 contains a valid preamble. If packet 204 contains a valid preamble, the system determines whether the amplitude increase (amplitude increase 672) is over a threshold. If it is not over the threshold, the system continues processing packet 202 and performs no further action on packet 204. If amplitude increase 672 is over the threshold, the system continues processing both packets 202 and 204 in a time period until a valid CRC status is found. In one embodiment, the time period is associated with packet lengths indicated in the packet headers of one or more overlapping packets (packets 202 and 204 in this example). If the valid CRC status is found during the time period, the packet associated with the valid CRC status is kept while the other is discarded. If no valid CRC status is found from packets 202 and 204, both packets are discarded. The embodiment applies to scenarios where the system processes multiple packets (e.g. packets 202 and 204) while another valid packet is detected (e.g. packet 206). In that case, amplitude increases 672 and 674 are considered, and either packet 202, 204 or 206 may be discarded. Further, the CRC statuses are checked until a valid CRC is found and the system uses the first identified valid CRC to determine the packet to keep. In this embodiment, the system may further use the destination of an incoming signal to determine whether to discard a packet carried in the signal.

In another embodiment, when the system processes packet 202, it monitors amplitude increases to signals carrying packet 204 and 206. That is, it compares amplitude increases 672 (from packets 202 to 204) and 674 (from packets 202 to 206) to a threshold value. The system uses both amplitude increase values and CRC statuses to determine which packet or packets to discard. The system may further use the destination of an incoming signal to determine whether to discard a packet carried in the signal in the embodiment.

When an integrated approach is taken, various settings may be different from where the first or the second approach is taken alone. For example, in FIG. 6, a sensitivity setting 670 applies to all incoming signals. When a signal has an amplitude level less than the sensitivity setting 670, the signal is discarded, even if it carries an otherwise recognizable packet (e.g., packet 208. The sensitivity setting 670 and amplitude increase threshold may be configured differently from a shared medium system where only the first or the second approach is implemented.

Figure 7:
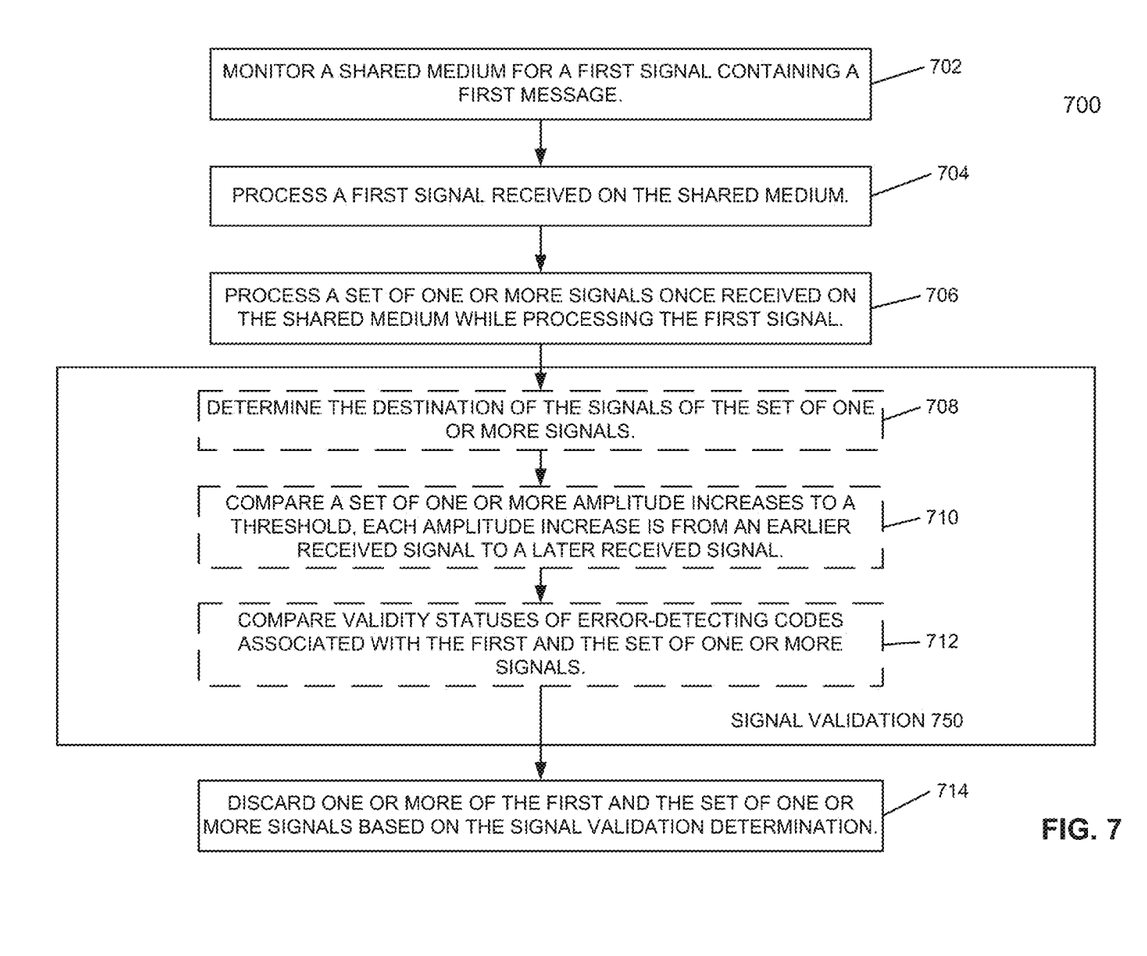
FIG. 7 is a flow diagram illustrating an integrated approach of processing overlapping signals at a node of a shared medium network according to an embodiment of the invention.

FIG. 7 is a flow diagram illustrating an integrated approach of processing overlapping signals at a node of a shared medium network according to an embodiment of the invention. Method 700 may be implemented on a node of a shared medium system. The shared medium is one of a power line, a radio frequency channel, an optical fiber, a copper line, and other suitable medium for communication (e.g., fluid, gas, or solid molecule vibration or motion), depending on implementation. The shared medium network contains a number of devices coupled to the shared medium, and the devices (e.g., nodes 102, 104, and 106 of FIG. 1) communicate through signals transmitted through the shared medium network.

Referring to FIG. 7, at reference 702, the method starts with a device of the shared medium system monitoring the shared medium for a first signal to process. In one embodiment, the first signal needs to have an amplitude higher than a sensitivity setting before it will be processed. When the first signal is recognized, it is processed for the message carried in the first signal at reference 704 by the device. While the device is processing the first signal, the device simultaneously monitors the shared medium. A set of one or more signals is received from the shared medium at reference 706. The set of one or more signals is received where signals within the set arrive at overlapping time, either with the first signal or with each other.

The method then goes through a signal validation stage illustrated as a box, signal validation 750. The signal validation stage may contain one or more blocks of references 708-712 depending on implementation. Signal validation may optionally include determining the destination of the signal of the set of one or more signals at reference 708. When a signal is not destined to the device, the signal will be discarded. Signal validation may optionally include comparing a set of one or more amplitude increases to a threshold at reference 710, where each amplitude increase is from a signal to a later received signal. In addition, signal validation may optionally include comparing validity status of error-detecting codes associated with the first and the set of one or more signals at reference 712. Based on the determination of reference 710, and/or comparisons at references 712 and 708, the device discards one or more signals at reference 714. Note ordering of references 708-712 can be different in different embodiments. The determination from references 708-712 does not necessarily depend on each other, thus various permutations of selection of one or more of references 708-712 and orderings of references 708-712 can be implemented utilizing the principle disclosed herein.

Figure 8:
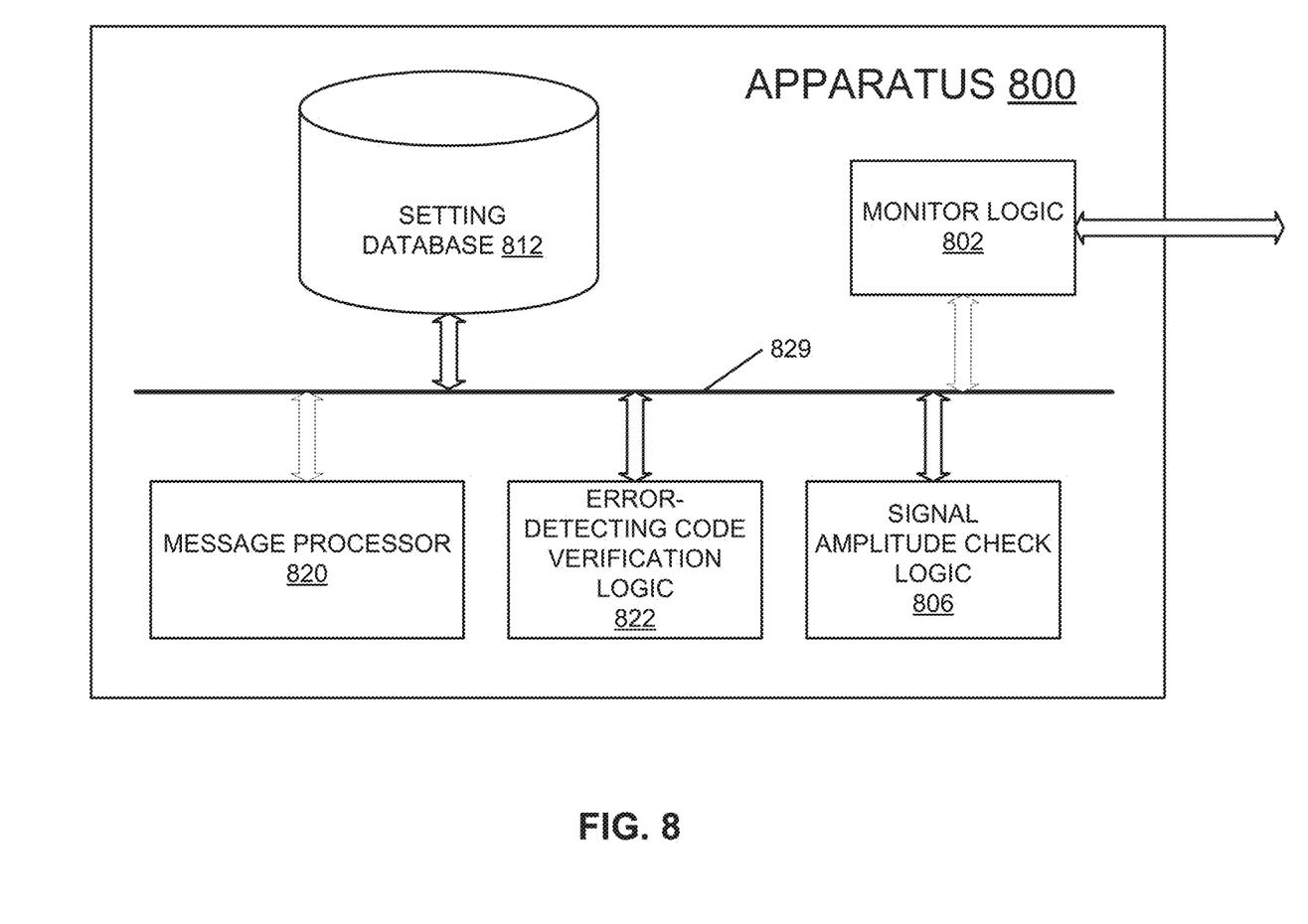
FIG. 8 illustrates an apparatus implementing the enhanced signal processing in a shared medium network according to an embodiment of the invention.

FIG. 8 illustrates an apparatus implementing the enhanced signal processing in a shared medium network according to an embodiment of the invention. The shared medium network contains a number of apparatuses coupled to the shared medium, and the apparatuses communicate through signals transmitted through the shared medium network. Apparatus 800 is a device, a node, or a terminal of a shared medium network. The shared medium is one of a power line, a radio frequency channel, an optical fiber, a copper line, and other suitable medium for communication (e.g., fluid, gas, or solid molecule vibration or motion), depending on implementation. When the shared medium is a power line, the signals transmitted across the PLC system may comply with various standards such as G3-Power Line Communication (PLC) physical layer specification, IEEE 1901.2 (currently "Draft" status), and ITU-T G. 9902 and G. 9903 and G.9904 (published).

Apparatus 800 contains a monitor logic 802, signal amplitude check module 806, error-detecting code verification logic 822, message processor 820, and setting database 812. These modules are coupled via interconnect 829, which may be a bus connection in one embodiment. Note apparatus 800 contains other modules and logic not shown as they are not essential to embodiments of the invention. The various logics may be implemented as a single unit, or multiple units can combine two or more units within apparatus 800. Not all embodiments of the invention contain all logics disclosed herein and some logics are not utilized in some embodiments and they may not be implemented these embodiments. Also, message processor 820 can be general purpose or special purpose processors. The individual logics can contain their dedicated network process units (NPUs) or they can share NPUs among multiple logics.

Monitor logic 802 is configured to monitor for signals on a shared medium of a shared medium network, with which apparatus 800 coupled. When medium monitor logic 802 recognizes a signal containing a message, it may forward to another module for further processing. In one embodiment, monitor logic checks the destination of a signal, and if the signal is not destined to apparatus 800, the signal is not forwarded within apparatus 800 for further processing.

Signal amplitude check logic 806 is configured to check the amplitude of a signal detected by monitor logic 802. In one embodiment, monitor logic 802 compares the amplitude of a signal with a sensitivity setting of apparatus 800, and if the amplitude of the signal is below the sensitivity setting, the signal is ignored and apparatus performs no further operation on the signal. Note the sensitivity setting may be stored in setting database 812. The sensitivity setting may be specific to apparatus 800, or it may be a same setting for all apparatus within a given shared medium network.

In one embodiment, when the apparatus 800 is processing an incoming signal (the first signal) at message processor 820, and a set of one or more signals is detected by monitor logic 802. Signal amplitude check logic 806 is configured to compare the amplitudes of the first and the signals of the set of one or more signals. Depending on the amplitude increases between signals, one or more signals will be discarded. For example, if the amplitude of a later received second signal of the set of one or more signals is higher than the first signal, and the amplitude increase is over a threshold, message processor 820 aborts processing of the first signal and starts processing the second signal.

In one embodiment, the threshold of amplitude increase can be stored in setting database 812. The threshold may be configurable, and it may be specific to apparatus 800, or a same value for all apparatus within a given shared medium network. The threshold may an absolute value of the amplitude increase or a relative change. For example, a logarithmic unit, the decibel (dB), is used to indicate the ratio of absolute values of amplitude. In some shared medium systems (e.g., a power line communication (PLC) system), amplitude changes widely—in a PLC system, amplitude change between signals can reach 80 dB. In these systems, the threshold value can be set relatively high. For example, a PLC system may set an amplitude increase threshold to be a value between 6 dB and 20 dB.

Error-detecting code verification logic 822 is configured to check validity status of error-detecting code of a message carried by a received signal and determine if the error-detecting code of the message is valid. The error-detecting code implemented can be based on a variety of coding schemes. For example, it can be a cyclic redundancy check (CRC) code, a checksum code, or other error-correcting codes. When the shared-medium system is a power line communication system, a variety of CRC code implementation may be suitable, for example, CRC-16, CRC-18, or CRC-32.

Message processor 820 is configured to process a message carried by an incoming signal. The message may take a variety of formats (e.g., Ethernet frames), Message processor 820 interacts with other logics of apparatus and determine which message to process.

In one embodiment, monitor logic 802 detects a first signal, and it is forwarded to message processor 820 for processing. While message processor 820 processes the first signal, monitor logic 802 continues monitoring the shared medium of the shared medium network. A set of one or more signals is detected by apparatus 800. The set of one or more signal is forwarded to signal amplitude check logic 806 to determine if there is an amplitude increase from the first signal to the signals of the set of one or more signals. If there is an amplitude increase, signal amplitude check logic 806 determines whether the amplitude increase is over an amplitude increase setting, which is stored in setting database 812. If signal amplitude check logic 806 determines that the amplitude increase is over the amplitude increase setting, message processor 820 aborts processing of an earlier signal in favor of the later signal with a higher amplitude.

In one embodiment, monitor logic 802 detects a first signal, and it is forwarded to message processor 820 for processing. While message processor 820 processes the first signal, medium monitor logic 802 continues monitoring the shared medium of the shared medium network. A set of one or more signals is detected destined to apparatus 800. The second signal is sent to message processor 820 for processing too. After both the first and the set of one or more signals are processed and a first and second messages are decoded from the first and the second signals, error-detecting verification logic 822 checks the validity statuses of the first and the set of one or more messages carried within the first and the set of one or more signals and determine which message to keep for further operations at apparatus 800. If only one message contains a valid validity status, the message is forwarded on for further operations while other message or messages is discarded. If more than one message contains valid validity statuses, signal amplitude check logic may check an amplitude change from an earlier signal to a later received second signal and discard one or more messages.

The operations of the flow diagram have been described with reference to the exemplary embodiment of FIG. 8. However, it should be understood that the operations of flow diagrams can be performed by embodiments of the invention other than those discussed with reference to FIGS. 3, 5, and 7, and the embodiments discussed with reference to FIG. 8 can perform operations different than those discussed with reference to the flow diagrams of FIGS. 3, 5, and 7.

Different embodiments of the invention may be implemented using different combinations of software, firmware, and/or hardware. Thus, the techniques shown in the figures can be implemented using code and data stored and executed on one or more electronic devices (e.g., an end system, a network device). Such electronic devices store and communicate (internally and/or with other electronic devices over a network) code and data using computer-readable media, such as non-transitory computer-readable storage media (e.g., magnetic disks; optical disks; random access memory; read only memory; flash memory devices; phase-change memory) and transitory computer-readable transmission media (e.g., electrical, optical, acoustical or other form of propagated signals—such as carrier waves, infrared signals, digital signals). In addition, such electronic devices typically include a set of one or more processors coupled to one or more other components, such as one or more storage devices (non-transitory machine-readable storage media), user input/output devices (e.g., a keyboard, a touchscreen, and/or a display), and network connections. The coupling of the set of processors and other components is typically through one or more busses and bridges (also termed as bus controllers). Thus, the storage device of a given electronic device typically stores code and/or data for execution on the set of one or more processors of that electronic device.

While the flow diagrams in the figures herein above show a particular order of operations performed by certain embodiments of the invention, it should be understood that such order is exemplary (e.g., alternative embodiments may perform the operations in a different order, combine certain operations, overlap certain operations, etc.).

While the invention has been described in terms of several embodiments, those skilled in the art will recognize that the invention is not limited to the embodiments described, can be practiced with modification and alteration within the spirit and scope of the appended claims. The description is thus to be regarded as illustrative instead of limiting.

What is claimed is:

1. A method comprising:
   monitoring for a first signal;
   processing the first signal received;
   receiving a set of one or more signals while processing the first signal;
   determining a set of one or more amplitude increases, wherein each amplitude increase is from an earlier received signal to a later received signal, and wherein each of the earlier received and the later received signals is one of the first and the set of one or more signals;
   comparing the set of one or more amplitude increases to a threshold value; and
   at least partially in response to the comparison, discarding one or more signals from the first signal and the set of one or more signals.

2. The method of claim 1, wherein the first signal is received over one of a power line, a radio frequency channel, an optical fiber, a copper line, fluid, gas, and solid molecule vibration or motion.

3. The method of claim 1, wherein an amplitude of each of the first signal and the set of signals are over a sensitivity setting.

4. The method of claim 1, wherein the threshold value is configurable.

5. The method of claim 1, wherein the threshold value is a value between 6 dB and 20 dB.

6. The method of claim 1, wherein the discarding one or more signals from the first signal and the set of one or more signals is further in response to a second comparison of validity statuses of error-detecting codes associated with messages carried by the first signal and the set of one or more signals.

7. The method of claim 1, wherein the discarding one or more signals from the set of one or more signals is in response a determination that the one or more signals received is not destined to the device.

8. A method comprising:
monitoring for a first signal on a shared medium;
processing the first signal received on the shared medium;
processing a set of one or more signals as the set of one or more signals is received from the shared medium while processing the first signal;
comparing validity statuses of error-detecting codes associated with messages carried by the first signal and the set of one or more signals; and
at least partially in response to the comparison, discarding one or more signals from the first signal and the set of one or more signals.

9. The method of claim 8, wherein an amplitude of each of the first signal and the set of signals are over a sensitivity setting.

10. The method of claim 8, wherein the discarding one or more signals from the first signal and the set of one or more signals is further in response to a comparison of a set of one or more amplitude increases to a threshold value, wherein each amplitude increase of the set of one or more amplitude increases is from a signal to a later received second signal, and wherein each signal is one of the first and the set of one or more signals.

11. The method of claim 8, wherein the discarding one or more signals from the set of one or more signals is further in response a determination that the one or more signals received is not destined to the device.

12. The method of claim 8, wherein the shared medium is one of a power line, a radio frequency channel, an optical fiber, a copper line, fluid, gas, and solid molecule vibration or motion.

13. The method of claim 12, wherein the error-detecting codes are one of a cyclic redundancy check (CRC) code and checksum code.

14. The method of claim 13, wherein the error-detecting codes are a CRC code, wherein the CRC code is one of CRC-16, CRC-18, and CRC-32.

15. An apparatus comprising:
a processor, and
memory to store instructions, which when executed by the processor provide:
a monitor to monitor for signals on a medium,
a message processor to process messages carried by signals received from the medium through the monitor; and
a signal amplitude checker to determine a set of one or more amplitude increases, each amplitude increase is from an earlier received signal to a later received signal, wherein each of the earlier received signal and the later received signal is one of the received signal, the signal amplitude checker to compare the set of one or more amplitude increases to a threshold value, and wherein the message processor is further to discard the processing of one or more signals at least partially in response to the comparison; and
a setting database configured to store the threshold value.

16. The apparatus of claim 15, wherein the medium is one of a power line, a radio frequency channel, an optical fiber, a copper line, fluid, gas, and solid molecule vibration or motion.

17. The apparatus of claim 15, wherein amplitudes of the signals are over a sensitivity setting, and wherein the sensitivity setting is stored in the setting database.

18. The apparatus of claim 15, further comprising: instructions stored in the memory to provide error-detecting code verification logic configured to compare validity statuses of error-detecting codes associated with messages carried by the signals received, wherein the message processor is to discard the processing of the one or more signals further in response to the comparison of validity statuses of error-detecting codes associated with messages carried by the signals received.

19. An apparatus comprising:
a processor, and
memory to store instructions, which when executed by the processor provide:
a monitor to monitor for signals on a shared medium;
a message processor to process messages carried by signals received from the shared medium through the monitor,
an error-detecting code verification logic to compare validity statuses of error-detecting codes associated with the messages carried by the signals received from the shared medium through the monitor, and
the message processor further to discard the processing of one or more signals at least partially based on the comparison by the error-detecting code verification logic.

20. The apparatus of claim 19, wherein the shared medium is one of a power line, a radio frequency channel, an optical fiber, a copper line, fluid, gas, and solid molecule vibration or motion.

21. The apparatus of claim 19, wherein the error-detecting codes are one of a cyclic redundancy check (CRC) code and checksum code.

22. The apparatus of claim 19, wherein amplitudes of the signals are over a sensitivity setting, and wherein the sensitivity setting is stored in a setting database.

23. The apparatus of claim 19, further comprising:
instructions stored in the memory to provide a signal amplitude checker to determine a set of one or more amplitude increases, each amplitude increase is from an earlier received signal to a later received signal, wherein each of the earlier received signal and the later received signals is one of the received signals, the signal amplitude checker to compare the set of one or more amplitude increases to a threshold value, and wherein the message processor is configured to discard the processing of one or more signals further in response to the comparison to the threshold value.

* * * * *